(12) United States Patent
Mouttet (10) Patent No.: US 7,902,867 B2
(45) Date of Patent: Mar. 8, 2011

(54) MEMRISTOR CROSSBAR NEURAL INTERFACE

(76) Inventor: Blaise Laurent Mouttet, Arlington, VA (US)

(*) Notice: Subject to any disclaimer, the term of this patent is extended or adjusted under 35 U.S.C. 154(b) by 157 days.

(21) Appl. No.: 12/379,312

(22) Filed: Feb. 19, 2009

(65) Prior Publication Data

US 2009/0163826 A1 Jun. 25, 2009

Related U.S. Application Data

(63) Continuation-in-part of application No. 11/976,925, filed on Oct. 30, 2007, now Pat. No. 7,564,262, which is a continuation-in-part of application No. 11/790,496, filed on Apr. 26, 2007, now Pat. No. 7,459,933, which is a continuation of application No. 11/395,237, filed on Apr. 3, 2006, now Pat. No. 7,302,513.

(51) Int. Cl.
*H03K 19/177* (2006.01)
*H01L 25/00* (2006.01)

(52) U.S. Cl. .............................. 326/41; 326/47; 977/940

(58) Field of Classification Search .................... 326/38, 326/39, 41, 47; 607/45; 977/708, 767, 880, 977/940
See application file for complete search history.

(56) References Cited

U.S. PATENT DOCUMENTS

| | | | |
|---|---|---|---|
| 6,993,392 B2 | 1/2006 | Nicolelis et al. | |
| 7,203,789 B2 * | 4/2007 | Snider | 710/317 |
| 7,302,513 B2 | 11/2007 | Mouttet | |
| 7,459,933 B2 | 12/2008 | Mouttet | |
| 7,483,747 B2 | 1/2009 | Gliner et al. | |
| 7,489,583 B2 | 2/2009 | Kuekes et al. | |
| 2007/0060831 A1 | 3/2007 | Le et al. | |
| 2007/0231972 A1 | 10/2007 | Mouttet | |
| 2008/0046023 A1* | 2/2008 | Fischell | 607/45 |
| 2008/0059688 A1 | 3/2008 | Mouttet | |
| 2008/0212382 A1 | 9/2008 | Mouttet | |
| 2008/0222342 A1 | 9/2008 | Mouttet | |

OTHER PUBLICATIONS

Ziegler et al., "The CMOS/NANO Interface from a Circuits Perspective", May 28, 2003, pp. 1-4.*
Strukov et al., The missing memristor found, Nature, May 1, 2008, 80-83, vol. 453.
Mouttet, Proposal for Memristor Crossbar Design and Applications, Memristor and Memristive Systems Symposium, Nov. 21, 2008, UC Berkeley.
Mouttet, Programmable Electronics using Memristor Crossbars, 2008 [retrieved from the internet<URL:http://knol.google.com/k/blaise-mouttet/>].
Mouttet, An Introduction to Memimpedance and Memadmittance Systems Analysis, 2009 [retrieved from the internet<URL:http://knol.google.com/k/blaise-mouttet/>].

* cited by examiner

*Primary Examiner* — Daniel D Chang (57) ABSTRACT

A device includes an array of electrodes configured for attachment in or on the human head interconnected to control circuitry via a programmable crossbar signal processor having reconfigurable resistance states. In various embodiments the device may be used as a controller for a video game console, a robotic prosthesis, a portable electronic device, or a motor vehicle.

13 Claims, 7 Drawing Sheets

MEMRISTOR CROSSBAR NEURAL INTERFACE

This patent application is a Continuation-In-Part of U.S. patent application Ser. No. 11/976,925, filed on Oct. 30, 2007 now U.S. Pat. No. 7,564,262 which is a Continuation-In-Part of U.S. patent application Ser. No. 11/790,496, filed on Apr. 26, 2007 (now U.S. Pat. No. 7,459,933) which is a Continuation of U.S. patent application Ser. No. 11/395,237, filed on Apr. 3, 2006 (now U.S. Pat. No. 7,302,513).

FIELD OF THE INVENTION

The present invention pertains to a neural interface device and methods including a programmable crossbar signal processor.

BACKGROUND OF THE INVENTION

As disclosed in the parent U.S. patent application Ser. No. 11/976,925, and U.S. Pat. Nos. 7,459,933 and 7,302,513, which are each incorporated by reference in their entirety, crossbar circuit architectures including programmable impedance states may provide for storage of data used in image and pattern processing. The present patent application provides further embodiments of such systems directed to neural interfaces.

In the past few years there has been an increasing interest in the development of computer/machine interfaces capable of detecting or stimulating mental states. These interfaces may be formed either via arrays of electrodes which are implanted in vivo to serve as a neural interface or via arrays of in vitro electrodes provided externally. Examples of prior art in this area include Gliner et al. U.S. Pat. No. 7,483,747 and Le et al. U.S. Patent Application 2007/0060831. A variety of diverse applications have been proposed for these types of neural interfaces including control of a motorized prosthesis such as a robotic limb, a video gaming controller, or the treatment of neural disorders. However, due to the large range of electrical patterns which the human brain can produce, it can become a difficult computational problem to classify the number of useful detectable patterns for such a neural interface. Solutions based on microprocessors are reliant on software which usually requires retrieval from a memory. Such memory retrieval can be time consuming and reduce the real-time responsiveness of the neural interface. Solutions based on application specific electronic hardware are also possible. However, such solutions can be limited in the number of possible thought patterns that can be identified and in the adaptability to new thought patterns.

SUMMARY OF THE INVENTION

The present invention provides a neural interface device and method offering improvements in speed and adaptability by using a programmable crossbar signal processor to record human thought patterns as resistance states of the crossbar.

The present invention provides a device including an array of electrodes configured for attachment in or on the human head, control circuitry, and a programmable crossbar signal processor having reconfigurable resistance states, wherein the programmable crossbar signal processor interconnects the array of electrodes and the control circuitry. The array of electrodes may be configured for in vivo attachment in the human head or configured for in vitro attachment on the human head.

In some embodiments the control circuitry may include current threshold detection circuitry such as a first operational amplifier with a feedback resistor and a second operational amplifier connected to the output of the first operational amplifier.

In some embodiments inverter circuitry may be electrically connected between the array of electrodes and the programmable crossbar signal processor.

In some embodiments time delay circuitry such as a shift register may be electrically connected to the output of the programmable crossbar signal processor.

In some embodiments control circuitry may be electrically connected to motors of a robotic system.

In some embodiments the control circuitry mat be electrically connected to a video gaming console.

A method of using the device may include programming the resistance states of the programmable crossbar signal processor based on signals received from the array of electrodes, wherein the signals received from the array of electrodes correspond to human thoughts or emotional states.

A method of using the device may include interconnecting the device with a video game console, programming the resistance states of the programmable crossbar signal processor based on signals received from the array of electrodes, and controlling actions in a video game with the device.

A method of using the device may include interconnecting the device with a robotic system, programming the resistance states of the programmable crossbar signal processor based on signals received from the array of electrodes, and controlling actions of the robotic system with the device.

In various embodiments the robotic system may include a prosthetic device or be part of a vehicular system.

A method of using the device may include interconnecting the device with a portable electronic device, programming the resistance states of the programmable crossbar signal processor based on signals received from the array of electrodes, and controlling the portable electronic device with the device. In some embodiments the portable electronic device may be communicated with wirelessly. In some embodiments the portable electronic device may be a telecommunication device. In some embodiments the portable electronic device may be a computing device.

DETAILED DESCRIPTION

Figure 1:
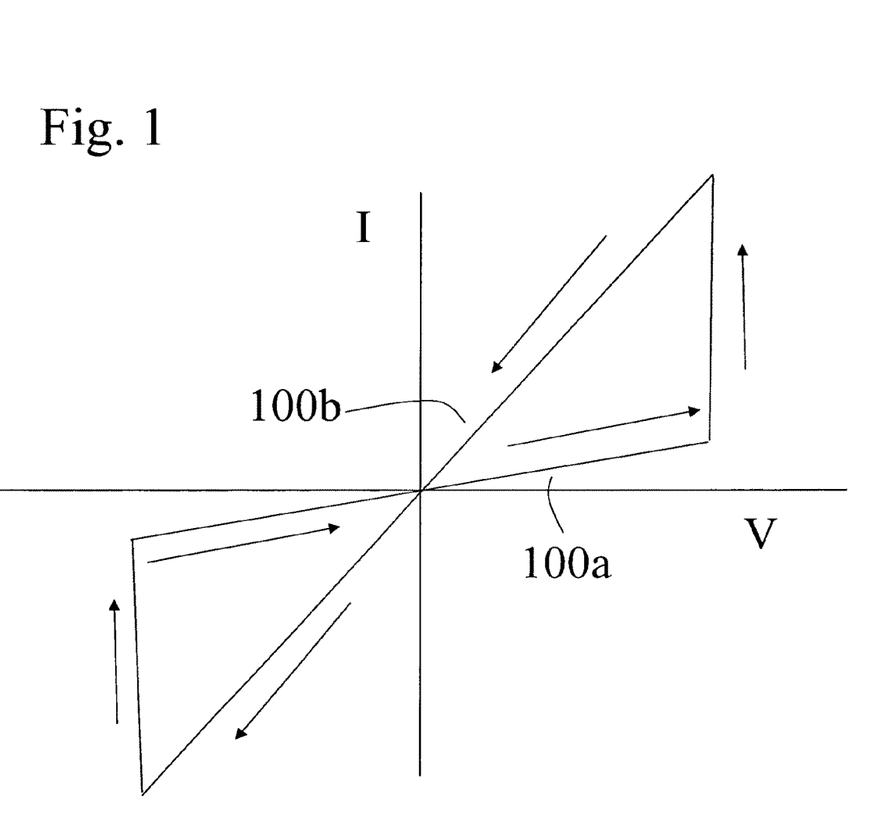
FIG. 1 illustrates an example of a pinched hysteresis curve associated with memristive materials.
Figure 2:
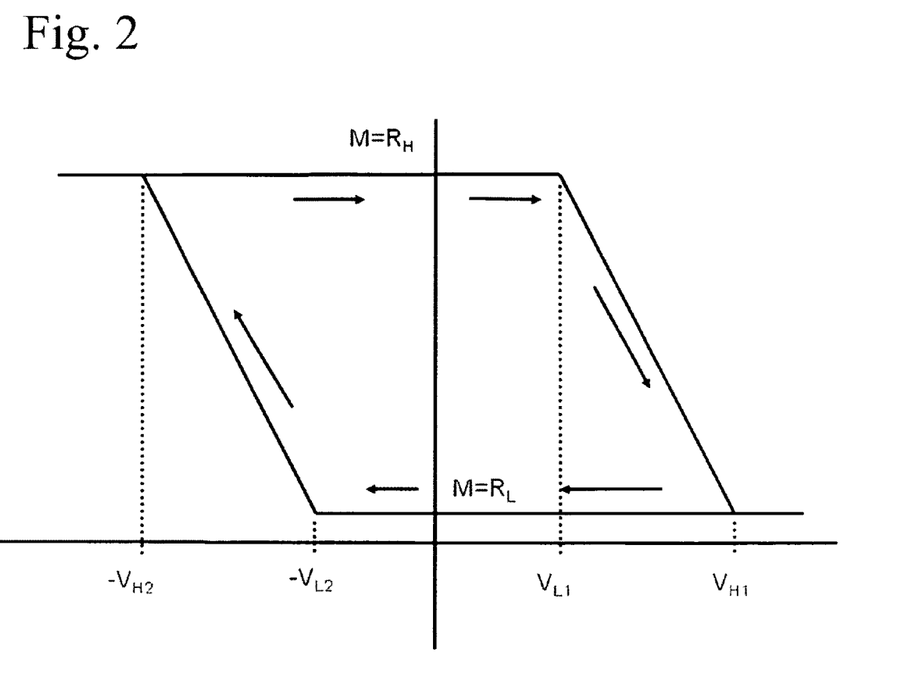
FIG. 2 illustrates an example of a switched resistance state curve associated with memristive materials.

As noted in the parent patent applications a variety of materials including TCNQ, chalcogenides, and thin film oxides such as perovskites exhibit resistance switching properties. Recently researchers at HP Labs have noted a connection between the properties of similar resistance switching materials and a theory by Prof. Leon Chua initially proposed in 1971 describing a "memristor" as a missing circuit element. One of the characteristics of such memristors is a zero-crossing hysteresis curve as exhibited by FIG. 1. HP Labs found that the current vs. voltage curve of Pt—$TiO_{2-x}$—Pt junctions match that of memristive systems and developed an equation defining the behavior in terms of ionic drift. As illustrated in FIG. 2 the behavior of these materials produce a switching between a high resistance state (M=$R_H$ in FIG. 2 or 101a in FIG. 1) and a low resistance state (M=$R_L$ in FIG. 2 or 101b in FIG. 1). In a positive voltage region $V_{L1}<V<V_{H1}$ memristance switching occurs between the high resistance state and the low resistance state. In a negative voltage region $-V_{H2}<V<-V_{L2}$ memristance switching occurs between the low resistance state and the high resistance state. However, in an intermediate small signal region $-V_{12}<V<V_{L1}$ the resistance is essentially fixed between two possible states.

More recently the concepts of memcapacitance and meminductance have been explored and the present inventor has proposed a more comprehensive theory in terms of memimpedance and memadmittance (see "An Introduction to Memimpedance and Memadmittance Systems Analysis", Google Knol). However, regardless of the theoretical background, these materials exhibit a key technological advantage since they are capable of both data storage in terms of high or low resistance states and signal processing as described in U.S. Pat. No. 7,302,513.

Figure 3A:
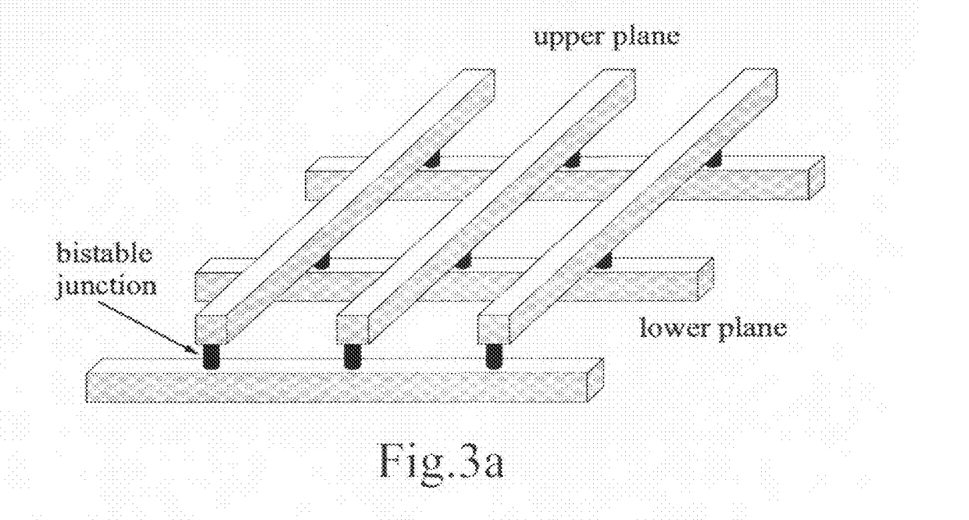
FIG. 3a illustrates a crossbar array including resistance switching bistable junctions.
Figure 3B:
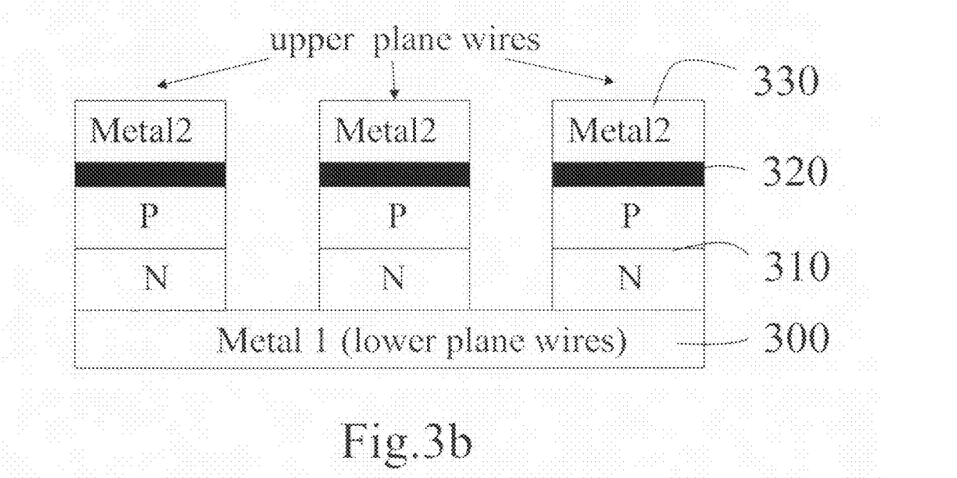
FIG. 3b illustrates the cross-section of a crossbar array including pn junction stacks.
Figure 4:
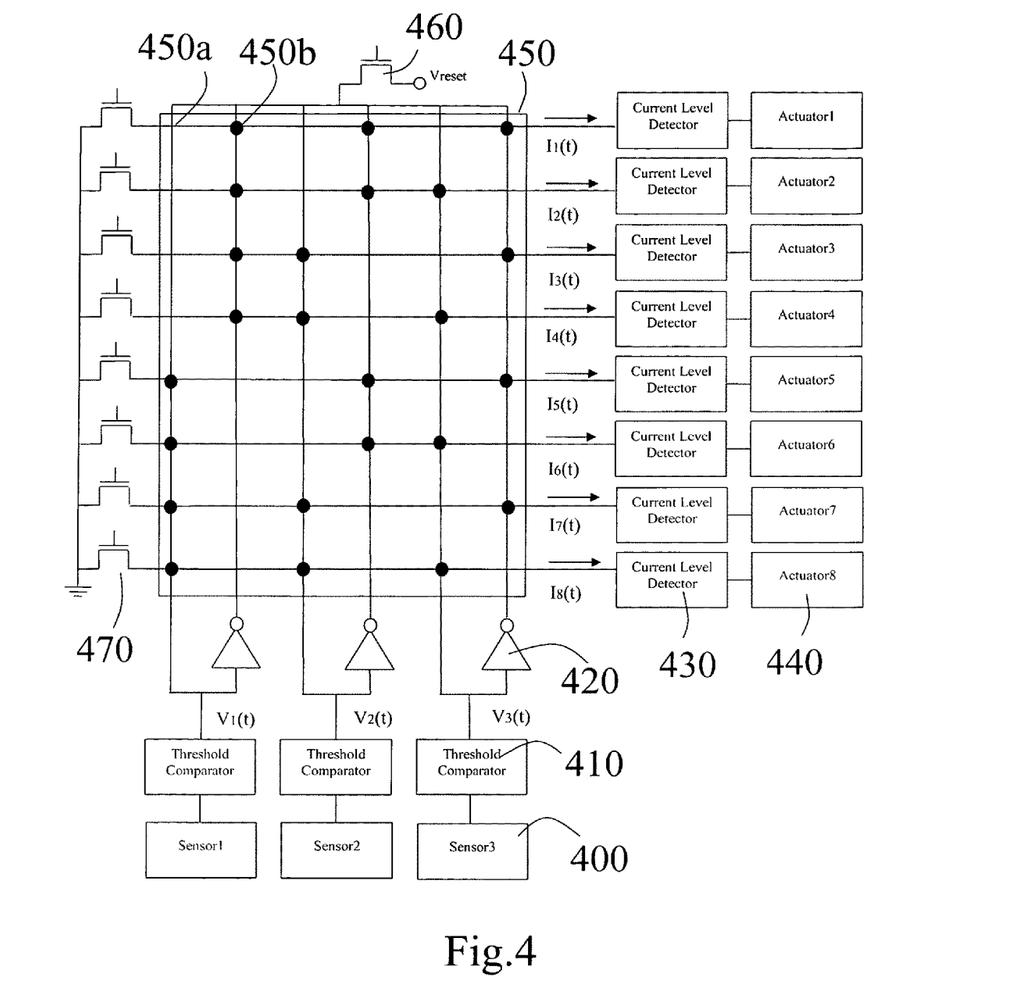
FIG. 4 illustrates an example of circuitry for a neural interface including a programmable crossbar signal processor connected to control circuitry and input electrodes.

FIG. 3a illustrates an example of a crossbar array for use in the present invention including a lower plane of electrical wires and an upper plane of electrical wires formed at an angle with respect to the lower plane. The bistable junctions between the two layers act as reconfigurable switches programmable to have a high resistance state or a low resistance state. FIG. 3b illustrates the cross-section of a similar crossbar array including a lower plane of metal wires 300, a pn junction layer 310, a programmable impedance or resistance switching layer 320, and an upper plane of metal wire 330. In this case the upper plane wires serve as inputs and the lower plane wires serve as outputs with the pn-junction layer providing a rectification layer to avoid internal feedback paths and set a controllable voltage threshold for stable behavior of the crossbar array in signal processing. On course various other arrangements of crossbars may be used in the present invention such as using doped silicon for the upper and lower wiring and controlling the doping to be p-type or n-type to provide the rectification effect. A dual back-to-back pn-junction configuration may also be used as described in U.S. Pat. No. 7,302,513 to provide ease of reversing the programmed resistance states. Either nanowire crossbar arrays of microscale wire crossbar arrays may be used. The materials for layer 320 may include chalcogenides, TCNQ, perovskites, and a variety of binary oxides such as $TiO_x$, $Cu_xO$, $ZrO_x$ and $HfO_x$, or any other material capable of resistance switching properties as are known to the art FIG. 4 illustrates an example of the circuitry used for the programmable crossbar neural interface of the present invention. An array of sensors 400 such as microelectrodes configured for attachment in the human head or an array of electrodes configured for attachment on the human head are provided to receive voltage pulses $V_1(t)$-$V_3(t)$ based on human thought patterns. An array of threshold comparators 410 are provided to distinguish the input voltages from noise or regulate the input voltage to a predefined range suitable as inputs to the programmable crossbar signal processor. The outputs from the threshold comparators 410 are input to an inverter array 420 which splits the signals into inverted and non-inverted voltages. The resistances states of a programmable crossbar array 450 are programmed to have complementary high resistance state such as 450a or low resistance states such as 450b such that that for every high resistance crosspoint in a particular row associated with an inverted input there exists a low resistance crosspoint in the same row associated with a non-inverted input and for every low resistance crosspoint in a particular row associated with an inverted input there exists a high resistance crosspoint in the same row associated with a non-inverted input. For a sufficiently large high-to-low resistance ratio this configuration produces an XNOR comparison function between the input voltage logic states and the programmed resistance logic states. The current levels $I_1(t)$-$I_8(t)$ at the output row are indicative of the degree of similarity between the voltage pattern and the stored resistance pattern. The array of current level detectors 430 measure the degree of similarity and provide a signal to the corresponding actuators 440 based on whether the current level is sufficient. It is noted that while an interlaced arrangements of the inverters is shown in FIG. 4 an equivalent arrangement may be formed based on distinct inverter groupings such as disclosed in the parent patent application Ser. No. 11/976,925.

In order to initialize the resistance states of the crossbar junctions an array of selection transistors 470 may be provided to select individual rows by connecting them to ground and the threshold comparator may be provided with a voltage amplifier stage to increase the input voltage to a sufficient level to switch the resistance states in correspondence to thought patterns being detected. The order of selection of the transistors may be under microprocessor control or may be chosen based on a manual selection of a user (e.g. pressing a button or switch). For example, when a user is thinking a particular thought and desires a specific response from a particular actuator 440 the user could press a button to select the transistor 470 associated with the row of the particular actuator concurrently with the thought. This action would then be recorded in terms of the resistance states of the crossbar row. A similar actuation could then be performed at a later time by thought alone based on the comparison of detected thought patterns to the stored resistance states in the crossbar array. In order to reset the crossbar array a reset transistor 460 and reset voltage (Vreset) may also be provided.

It is noted that while the configuration of FIG. 4 includes a 3×8 programmable crossbar array other sizes are obviously possible. A larger number of sensing electrodes could distinguish a larger number of mental states and dozens or hundreds of electrodes could be provided to a programmable crossbar signal processor having dozens or hundreds of columns. Similarly the number of rows would be determined by the number of actuated elements desired in a particular application which may number from as small as two to several hundred or more.

It is also noted that since the resistance states are reconfigurable the particular actuators activated by a particular thought can be reprogrammed at a later time. In the example of FIG. 4 the illustrated resistance states of the crossbar lead to the actuation table below in which low sensor signals (below the thresholds set by 410) are a logic zero and high sensor signals (above the thresholds set by 410) are a logic 1. However, resetting one, several, or all of the rows can provide alteration in the association between detected thoughts and actuation patterns.

TABLE 1

| Sensor 1 | Sensor 2 | Sensor 3 | Actuator activated |
|---|---|---|---|
| 0 | 0 | 0 | Actuator 1 |
| 0 | 0 | 1 | Actuator 2 |
| 0 | 1 | 0 | Actuator 3 |
| 0 | 1 | 1 | Actuator 4 |
| 1 | 0 | 0 | Actuator 5 |
| 1 | 0 | 1 | Actuator 6 |
| 1 | 1 | 0 | Actuator 7 |
| 1 | 1 | 1 | Actuator 8 |

The circuit configuration of FIG. 4 may of course be combined with a variety of preprocessing circuitry between the sensor electrodes and the programmable crossbar signal processor to smooth out noise or filter out frequencies not correlated to thought patterns as is known in the art. Frequency-to-voltage conversion circuitry may also be useful as preliminary circuit stages between the sensor electrodes and the crossbar signal processor. In addition, instead of each crossbar row having a dedicated actuator, sample-and-hold and multiplexing circuitry may be provided to detect a particular sequence of thought patterns from different rows of the crossbar and an actuator may be provided to be responsive to this particular sequence.

Figure 5:
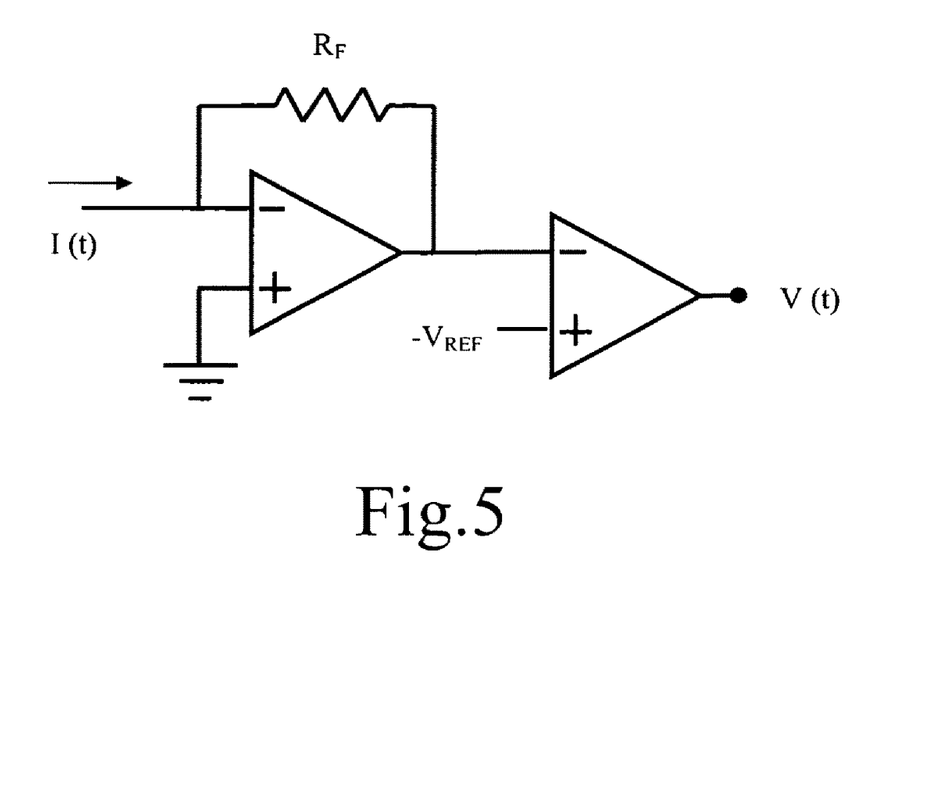
FIG. 5 illustrates an example of a current level detector.
Figure 6:
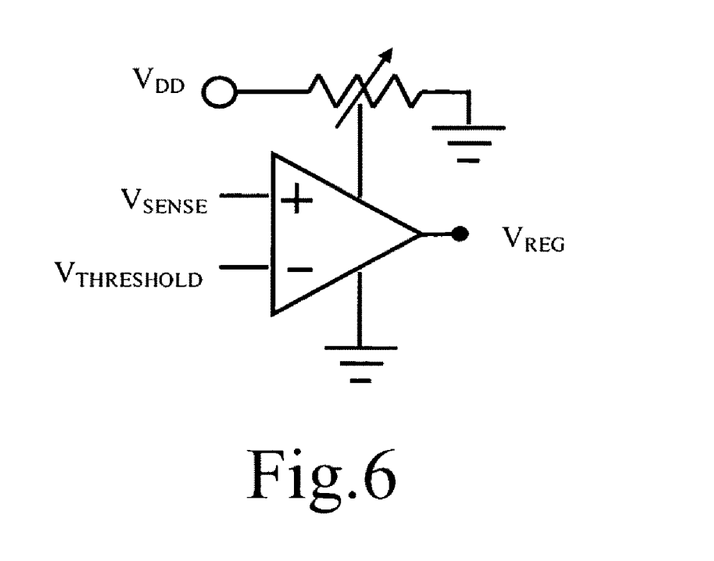
FIG. 6 illustrates an example of a threshold detector.

Many possible choices of circuitry forming the threshold comparators 410 and current level detectors 430 may be used in combination with the present invention. A simple example of a current level detector is given by FIG. 5 illustrating a first operational amplifier having a feedback resistor $R_F$ forming a current-to-voltage converter electrically connected to a second operational amplifier having a voltage reference $-V_{REF}$ serving as a comparator. Variation of $V_{REF}$ can be used to tune the comparison state and allow for a certain degree of bit errors between the input voltage levels and the stored resistance states. FIG. 6 illustrates an example of a threshold comparator in the form of a differential amplifier in which a sensed voltage $V_{SENSE}$ greater than a predetermined threshold voltage $V_{THRESHOLD}$ determines the state of the voltage $V_{REG}$ to be transmitted to the programmable crossbar array. The range of the output $V_{REG}$ can be regulated by controlling the power supply voltages to the differential amplifier and can be used to set the programmable crossbar signal processor to a programming mode in which the resistance states are switched using a high voltage or a pattern comparison mode in which the resistance states are stable using a low voltage. It is noted that the power supply voltage for the inverters 420 could similarly be adjusted when switching between a programming and pattern comparison mode.

Figure 7:
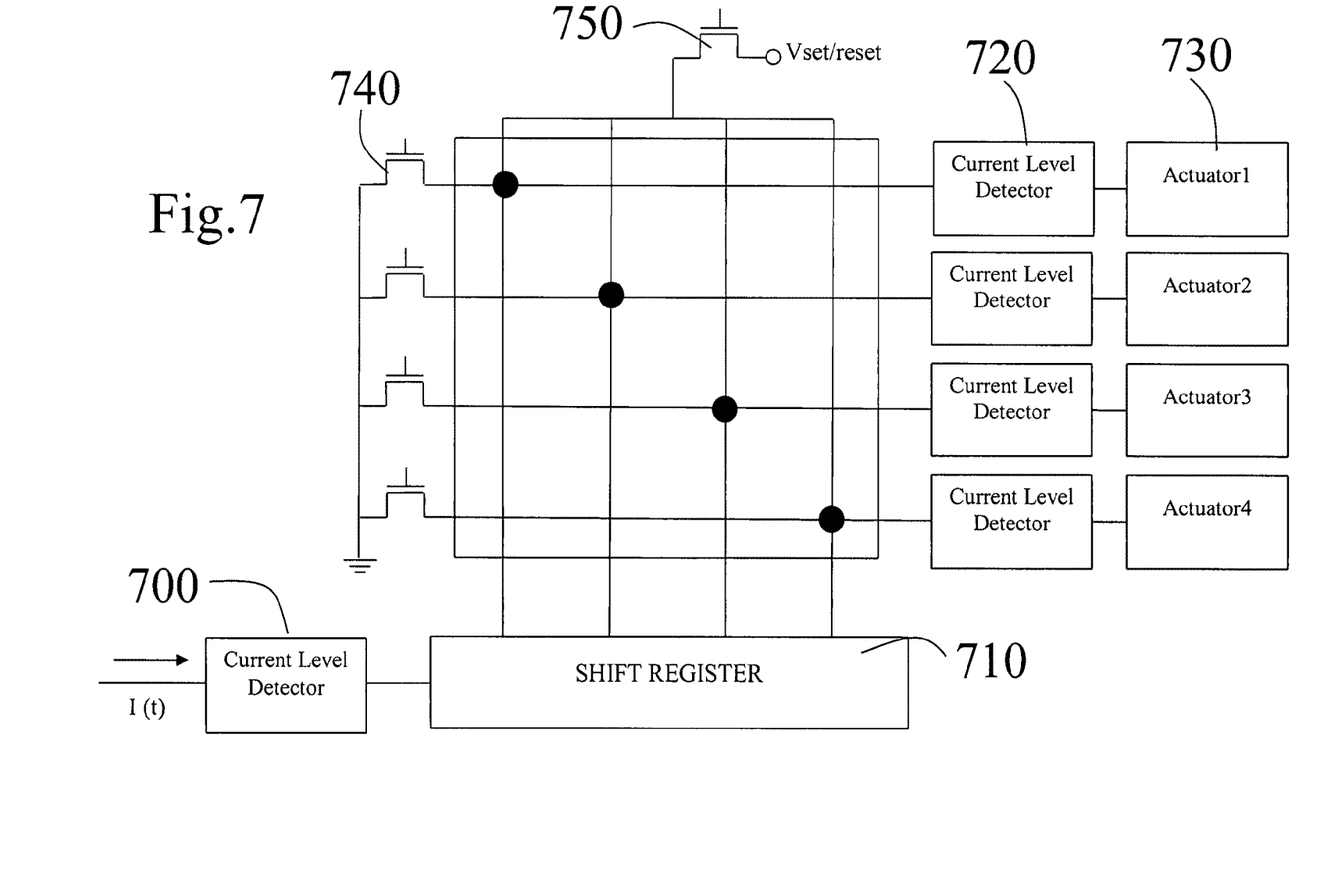
FIG. 7 illustrates an example of a sequencer circuit formed from a programmable crossbar array and time delay circuitry.

In further embodiments it may be desirable for a particular detected thought to trigger a sequence of actuating signals. For example, the control of a robotic arm to pick up an object may involve the sequenced control of a dozen motors in a particular order initiated by a single input. FIG. 7 illustrates a circuit configuration to enable such sequenced behavior based on the current output from a single row of the crossbar array of FIG. 4. In this case a current level detector 700 may load in a bit to a sequential time delay circuit such as a shift register. The shift register may sequentially transfer the bit to actuate another programmable crossbar signal processor and actuate actuators 730 in a particular sequence dependent on the programmed resistance states and the current level detectors 720. In the illustrated example the order of actuation is actuator 1, actuator 2, actuator 3, and actuator 4. However, as many as $2^{16}$ (approx. 64,000) states are possible for a 4×4 crossbar configuration as shown and, depending on the application, both the timing and the sequencing of the actuation signals can be adjusted as desired via the ground selection transistors 740 and set/reset transistor 750. Of course, different sizes of the crossbar array would be obvious depending on the application. Co-pending U.S. Patent Application 2008/0212382 is noted as providing some further embodiments of this configuration.

One example of an application of the present invention is in the control of a robotic system such as found in a prosthetic limb or device. In this case the actuators 440 could be motors and a user could selectively actuate transistors 470 in a "program mode" of the crossbar resistance states with a correspondence between thoughts of the desired movement and the particular motors of the robotic limb that are desired to be activated. In another embodiment microprocessor assisted programming may be achieved based on experimental templates associating particular signals in regions of the brain and responses of natural limbs.

Another example of an application of the present invention is in thought-based control of motorized vehicles such as automobiles or aircraft. Taking the example of an aircraft, the actuators 440 could be used to regulate the various controls which are conventionally regulated by manual activity of the pilot. During a training phase the pilot could wear the electrodes as part of a cap or helmet and concurrently control the plane as the pilot's mental states are sensed and recorded by the programmable crossbar signal processor. Concurrently, the actuation signals of the aircraft controls initiated by the pilot could selectively actuate transistors 470 so that the proper associations between the pilot's thoughts and the intended actuation are recorded. At a later time similar thought patterns for the pilot could actuate the same controls without the requirement of actual physical manipulation of the controls as long as the pilot's detected mental states accurately match the intention of the control manipulation. While safeguards would naturally be desirable for this type of application improvements in response time could be highly advantageous in some scenarios.

Another potential application of the present invention is the control of a video game console. The programming of resistance states of the crossbar array signal processor via an electrode cap could coincide with a player's manipulation of a game controller so as to form a mapping between the player's thought patterns and the movement of a joystick and/or pressing of particular buttons on the controller. At a later time the gameplay associated with the particular joystick movements or button pressing could be directly controlled by the player's thoughts without the requirement of the actual game controller as long as the player's detected mental states match the same intention of the control manipulation.

Another potential application of the present invention is the control of a portable electronic device such as a cell phone, mobile media player, or laptop computer. Functions such as turning the device on or off, volume control, channel control, etc. could be trained as explained in the earlier examples. Of course a wireless connection may also be included in the control as is well known to the electronics art.

While the above embodiments all describe electrodes sensing thought signals that are recorded in a programmable crossbar signal processor, the device of the present invention may be implemented in a neural stimulation system as well. In this case the electrodes 400 of FIG. 4 could be connected to a control circuit or microprocessor arranged to provide stimulation signals to neural tissue and the actuators 440 would be the electrodes connected in or on the human head. The function of the programmable crossbar signal processor would then be to decode the input voltage signals and provide stimulation to selected areas based on the programmed resistance states of the crossbar.

Figure 8:
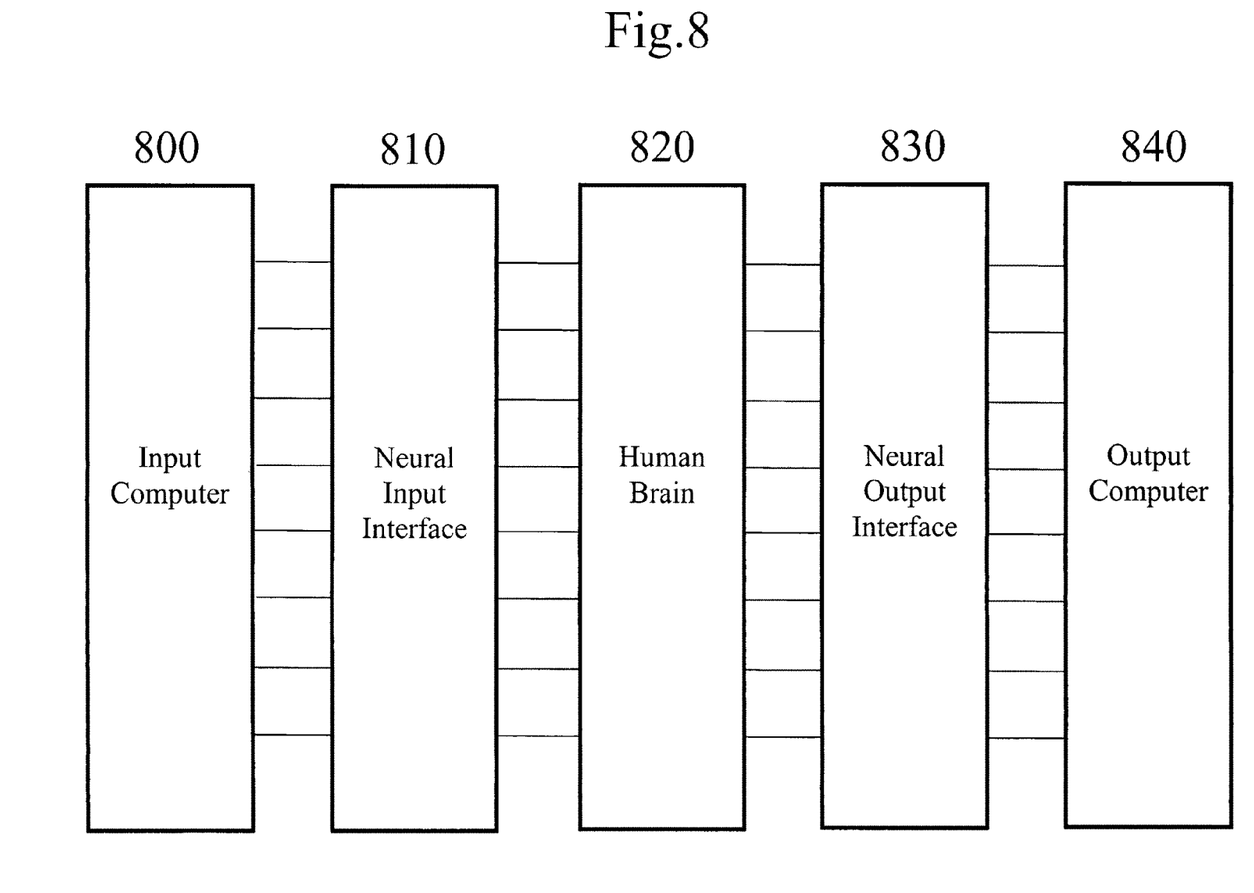
FIG. 8 illustrates a block diagram of a computer-brain interface.

FIG. 8 illustrates an example in which both neural detection and neural stimulation can be performed by using two different programmable crossbar signal processors. An input computer 800 provides voltage signals which are decoded by a first neural input interface 810 which provides stimulation to selected areas of the brain 820 based on programmed resistance states of the crossbar array associated with interface 810. Meanwhile, a second neural output interface 830 detects voltage signals in the brain and translates then to output computer 840 based on programmed resistance states of the crossbar array associated with interface 830. If input computer 800 is the same as, or simultaneously coordinated with, output computer 840 a closed loop feedback system can be generated applicable to treatment of neurological disorders. There may also be some potential for such a feedback system to virtual reality systems if the neural input interface is interconnected with audio, visual, or tactile sensing inputs.

As described above many modifications of the present invention are possible and many applications are possible. The present invention is only limited by the following claims.

I claim:

1. A device including:
   an array of electrodes configured for attachment in or on the human head;
   current threshold detection circuitry; and
   a programmable crossbar signal processor having reconfigurable resistance states, wherein the programmable crossbar signal processor interconnects the array of electrodes and the current threshold detection circuitry.

2. The device of claim 1 wherein the array of electrodes is configured for attachment in the human head.

3. The device of claim 1 wherein the array of electrodes is configured for attachment on the human head.

4. The device of claim 1 wherein the current threshold detection circuitry includes a first operational amplifier with a feedback resistor and a second operational amplifier connected to the output of the first operational amplifier.

5. The device of claim 1 wherein inverter circuitry is electrically connected between the array of electrodes and the programmable crossbar signal processor.

6. The device of claim 1 wherein the control circuitry is electrically connected to motors of a robotic system.

7. The device of claim 1 wherein the control circuitry is electrically connected to actuators of a video gaming console.

8. A device including:
   an array of electrodes configured for attachment in or on the human head;
   control circuitry; and
   a programmable crossbar signal processor having reconfigurable resistance states, wherein the programmable crossbar signal processor interconnects the array of electrodes and the control circuitry wherein time delay circuitry electrically connects an output of the programmable crossbar signal processor to the input of another programmable crossbar signal processor.

9. The device of claim 8 wherein the time delay circuitry is a shift register.

10. A method including the steps of:
    interconnecting an array of electrodes configured for attachment in or on the human head with current threshold detection circuitry via a programmable crossbar signal processor having reconfigurable resistance states; and
    programming the resistance states of the programmable crossbar signal processor based on signals received from the array of electrodes.

11. The method of claim 10 wherein the signals received from the array of electrodes correspond to human thoughts or emotional states.

12. The method of claim 10 further including the step of controlling actuators of a video game console via the programmable crossbar signal processor.

13. The method of claim 10 further including the step of controlling actuators of a robotic system via the programmable crossbar signal processor.

* * * * *

UNITED STATES PATENT AND TRADEMARK OFFICE
CERTIFICATE OF CORRECTION

| | | |
|---|---|---|
| PATENT NO. | : 7,902,867 B2 | Page 1 of 1 |
| APPLICATION NO. | : 12/379312 | |
| DATED | : March 8, 2011 | |
| INVENTOR(S) | : Blaise Laurent Mouttet | |

It is certified that error appears in the above-identified patent and that said Letters Patent is hereby corrected as shown below:

In column 8, line 4 replace "control circuitry" with --current threshold detection circuitry--.

In column 8, line 6 replace "control circuitry" with --current threshold detection circuitry--.

Signed and Sealed this
Seventeenth Day of May, 2011

David J. Kappos
*Director of the United States Patent and Trademark Office*